(12) United States Patent
Secker et al.

(10) Patent No.: US 6,538,336 B1
(45) Date of Patent: Mar. 25, 2003

(54) WIREBOND ASSEMBLY FOR HIGH-SPEED INTEGRATED CIRCUITS

(75) Inventors: David A. Secker, Sunnyvale, CA (US); Nirmal Jain, Pleasanton, CA (US)

(73) Assignee: Rambus Inc., Los Altos, CA (US)

( * ) Notice: Subject to any disclaimer, the term of this patent is extended or adjusted under 35 U.S.C. 154(b) by 271 days.

(21) Appl. No.: 09/715,357

(22) Filed: Nov. 14, 2000

(51) Int. Cl.[7] ............................................... H01L 23/48
(52) U.S. Cl. ........................ 257/786; 257/784; 257/659
(58) Field of Search ................................ 257/678, 728, 257/784, 786, 659

(56) References Cited

U.S. PATENT DOCUMENTS

| | | | |
|---|---|---|---|
| 5,616,952 A | * | 4/1997 | Nakano et al. ............. 257/659 |
| 5,734,559 A | | 3/1998 | Banerjee et al. ............ 361/761 |
| 5,741,726 A | | 4/1998 | Barber ........................ 437/216 |
| 5,801,450 A | | 9/1998 | Barrow ....................... 257/784 |
| 5,818,114 A | | 10/1998 | Pendse et al. .............. 257/786 |
| 6,008,532 A | | 12/1999 | Carichner ................... 257/691 |
| 6,043,559 A | | 3/2000 | Banerjee et al. ............ 257/700 |
| 6,064,113 A | | 5/2000 | Kirkman ..................... 257/691 |

* cited by examiner

Primary Examiner—Roy K. Potter
(74) Attorney, Agent, or Firm—Arthur J. Behiel

(57) ABSTRACT

A semiconductor device assembly facilitates high-speed communication between an integrated-circuit die and external circuitry. The die is mounted on a wiring board that includes rows of bond sites in which the signal-bearing bond sites are separated by bond sites bearing DC voltage levels. Signal-bearing bond wires extending from the bond sites are thus separated from one another by bond wires at fixed voltage levels. This arrangement improves shielding between signal wires, thereby minimizing cross-talk and facilitating high data rates.

27 Claims, 8 Drawing Sheets

US 6,538,336 B1

WIREBOND ASSEMBLY FOR HIGH-SPEED INTEGRATED CIRCUITS

FIELD OF THE INVENTION

This invention relates generally to semiconductor device assemblies, and in particular, to integrated-circuit packages.

BACKGROUND

Semiconductor dies are typically enclosed within a protective package that includes a variety of pin-out or mounting and interconnection schemes. More sophisticated integrated-circuit packages have been developed for very large scale integration ("VLSI") semiconductor dies. Such integrated circuit packages can accommodate the increased number of external connections required for packaging ever more complex integrated circuits.

FIG. 1A (Prior Art) depicts a portion of a semiconductor device assembly 100. Assembly 100 includes a wiring board 105 upon which is mounted a semiconductor die 110. Wiring board 105 includes an insulating substrate 115 upon which is formed a number of patterned conductive features, including a number of bond sites 120, bond traces 125, and a power trace 130 (though not shown, power trace 130 typically surrounds die 110). Bond sites 120, often referred to as bond "fingers," are areas of metalization having dimensions specified by the selected bonding process.

Semiconductor die 110 includes a number of gold-plated bond pads 135 that provide access to electrical circuits (not shown) within semiconductor die 110. Gold bond wires 140 extending between bond pads 135 and either power trace 130 or bond sites 120 allow semiconductor die 110 to receive power from and communicate signals to and from wiring board 105. Bond sites 120 and power trace 130 are further connected by vias and conductive leads (not shown) to some external circuitry with which the circuitry within die 110 is to communicate. Wire bonds 142, or just "bonds," connect bond sites 120 and bond pads 135 to bond wires 140.

Power trace 130 connects a number of bond pads 135 to DC power signals, such as VDD or ground potential. Additional power rings may also be provided, but are omitted here for simplicity. Bond sites 120 may also connect to DC power signals, but are more often used to transmit digital logic signals between semiconductor die 110 and wiring board 105. In FIG. 1A, bond wires conveying power signals are designated using dashed lines, whereas bond wires conveying signals having alternating voltage levels (e.g., clock and data lines) are designated using solid lines.

The term "semiconductor device assembly" refers to a semiconductor die, one or more wiring boards, and the associated structure with which the semiconductor die is connected, including connections to a socket or system printed circuit board, and internal connections such as bond wiring. For a more detailed description of a semiconductor device assembly similar to the one described in FIGS. 1A and 1B, see U.S. Pat. No. 5,741,726 to I. Barber, which is incorporated herein by reference.

As integrated circuit fabrication technology improves, manufacturers are able to integrate additional and faster functions onto a single semiconductor device. The increased number of functions mandates additional and more closely spaced signal paths between the semiconductor die and the corresponding wiring board, while the increased speed renders adjacent signals more sensitive to errors induced by higher mutual coupling between adjacent signal lines. Power planes (e.g., a ground plane) extending beneath bond pads, bond sites, and bond traces reduce mutual inductance between surface features. Returning to FIG. 1A, for example, wire board 105 includes a power plane 145 that extends beneath bond sites 120 and bond traces 125 to reduce mutual coupling. Unfortunately, such planes do little to shield bond wires, which extend well above the wiring board. Consequently, mutual coupling, also known as "cross-talk," is particularly problematic between bond wires.

FIG. 1B (Prior Art) is a profile view of semiconductor device assembly 100 of FIG. 1A. As is typical, bond pads 135 are arranged in rows parallel with an edge of die 110, an exterior row 150 (exterior to the center of die 110) and an interior row 155 in the depicted embodiment. The bond wires 140 extending from interior row 155 to respective ones of bond sites 120 share a common wire-loop profile 160. In contrast, the bond wires 140 from exterior row 150 alternatively extend to power trace 130 and bond sites 120, and consequently present two distinct wire-loop profiles 165 and 170, respectively. Profiles 165 and 170 define a current-loop area 175; unfortunately, current-loop area 175 results in excessive magnetic flux linkage and mutual inductive coupling between neighboring signal wires. High-frequency electrical performance suffers as a result, a significant disadvantage in an industry where speed-performance is paramount. There is therefore a need for a semiconductor device assembly that offers improved speed performance.

SUMMARY

The present invention is directed to a semiconductor device assembly that enables integrated circuits to communicate with external circuitry at higher speeds. In an embodiment that includes an integrated circuit die with interior and exterior bond-pad rows arranged along an edge of the die, the die is mounted on a wiring board that includes exterior and interior wire-bond rows and a novel arrangement of bond traces conveying signals to and from, the bond sites. Bond wires connect each bond pad in the external bond-pad row to a corresponding bond site in the internal wire-bond row, and other bond wires connect each bond pad in the internal bond-pad row to a corresponding bond site in the external wire-bond row. This arrangement minimizes the current-loop areas between bond wires adapted to carry high-speed signals, and therefore minimizes the cross coupling between adjacent signal lines.

In one embodiment, the bond pads and bond sites are arranged so the bond wires that extend between them collectively form a portion of a high-speed data bus for conveying a plurality of fast-switching signals. This embodiment minimizes cross-talk between neighboring signal lines by extending a bond wire conveying a DC (e.g., power-supply) voltage between each pair of bond wires conveying fast-switching signals. Preferably, no high-speed signals in the same bus are present on adjacent bond wires. In addition to separating the bond wires extending from each row, another embodiment provides further shielding by arranging DC or slow-switching bond wires above or below high-speed bond wires in an adjacent row. In this configuration, bond wires conveying high-speed signals are shielded by adjacent bond wires in the same row and by adjacent bond wires above.and/or below in other rows. This arrangement advantageously facilitates high-speed communication between integrated circuits and external circuits and further allows for closer spacing of bond wires.

This summary does not limit the invention, which is instead defined by the appended claims.

DETAILED DESCRIPTION

Figure 2A:
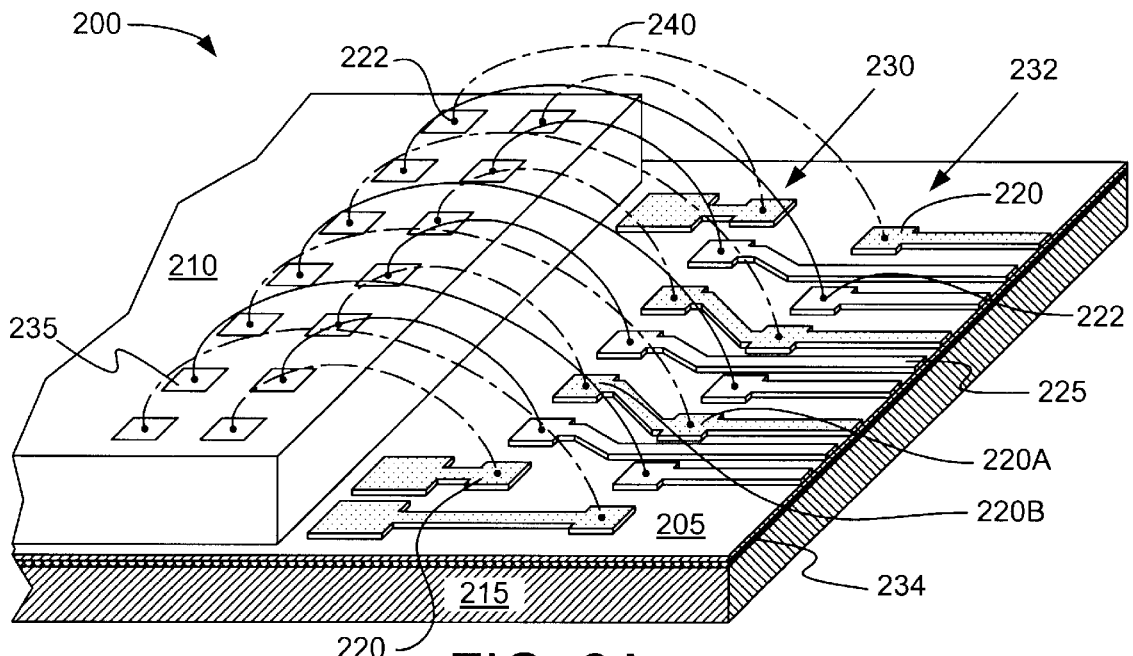
FIG. 2A depicts a portion of a semiconductor device assembly 200 in accordance with one embodiment of the invention.

FIG. 2A depicts a portion of a semiconductor device assembly 200 in accordance with one embodiment of the invention. Assembly 200 includes a wiring board 205 upon which is mounted a semiconductor die 210. Wiring board 205 includes an insulating substrate 215 upon which is formed a number of patterned conductive features, including a number of bond sites 220 and bond traces 225. Bond sites 220 and respective wire bonds 222 are arranged along at least two wire-bond rows, an internal wire-bond row 230 and an external wire-bond row 232 in the depicted embodiment. Wiring board 205 is a multi-layer board, and includes at least one additional layer of conductors, a ground plane 234, for example. Other layers are omitted for brevity.

Semiconductor die 210 includes a number of bond pads 235, also known as "die pads," that provide access to electrical circuits (not shown) within semiconductor die 210. Bond wires 240 extending between bond pads 235 and either interior wire-bond row 230 or exterior wire-bond row 232 allow semiconductor die 210 to communicate signals to and from wiring board 205. Wire-bond rows 230 and 232 are further connected by vias and conductive leads (not shown) to some external circuitry with which the circuitry within die 210 is to communicate. As described below in more detail, bond pads 235 and bond sites 220 are arranged to minimize the current-loop areas between bond wires, and therefore minimize the cross coupling between adjacent signal lines.

In FIG. 2A, bond traces and bond sites used to convey DC (e.g., power-supply) signals are shaded to distinguish them from bond traces and bond sites used to convey signals (e.g., data and clock signals) that switch at high speeds. Bond wires employed to convey such high-speed signals are referred to herein as "signal wires," whereas bond wires employed to convey relatively slow or DC voltage levels are referred to as "shield wires."

Bond sites 220 are arranged so that no two signal wires are adjacent in the same wire-bond row. In this arrangement, shield wires—typically conveying DC voltage levels—separate adjacent signal wires. The resulting shielding minimizes cross-talk between neighboring signal lines. In other embodiments, bond wires conveying relatively low-frequency signals, such as control signals, are used to provide shielding between bond wires conveying relatively high-frequency signals, such as high-bandwidth data lines.

Figure 1A:
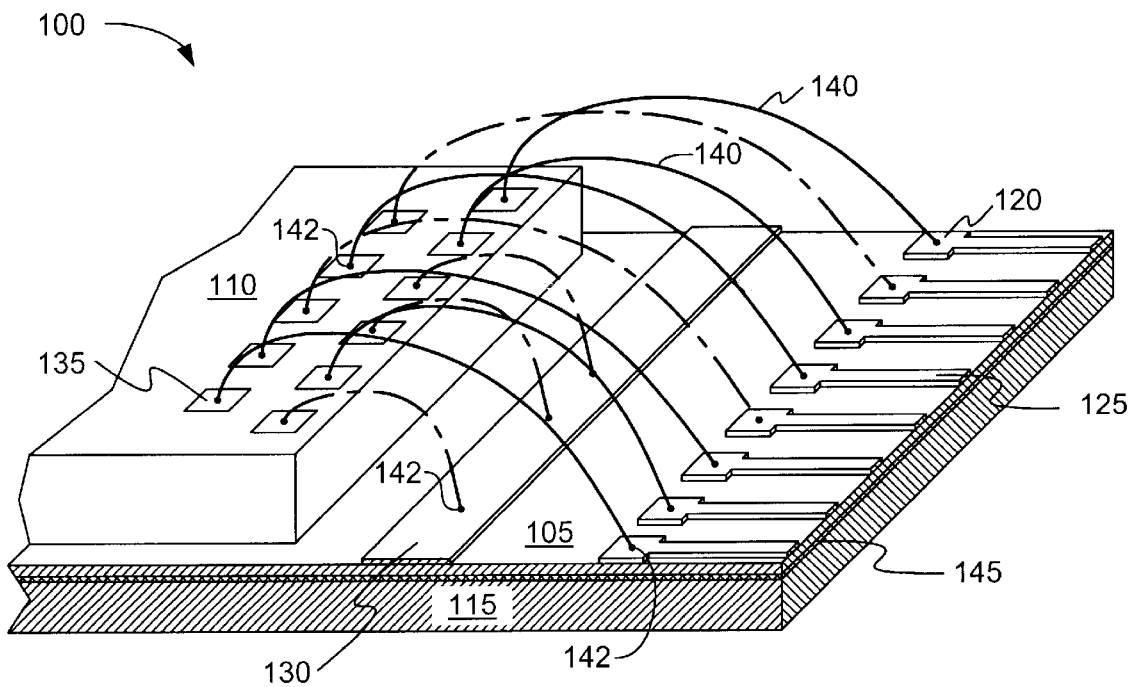
FIG. 1A (prior art) depicts a portion of a conventional semiconductor device assembly 100.
Figure 2B:
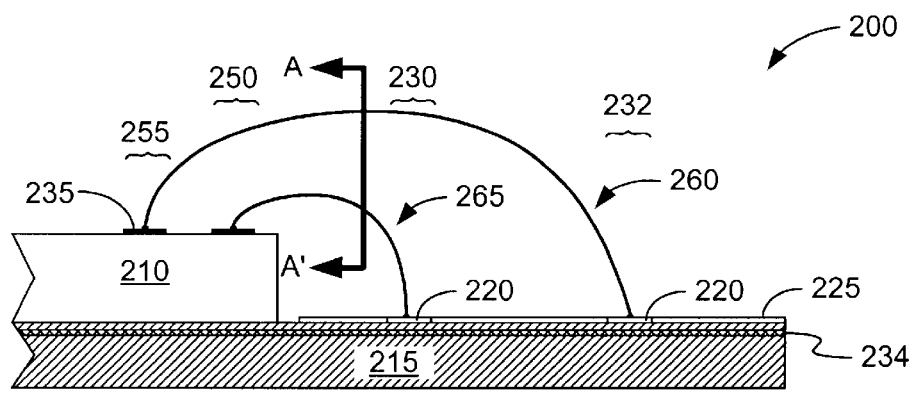
FIG. 2B is a profile view of semiconductor device assembly 200 of FIG. 2A.

FIG. 2B is a profile view of semiconductor device assembly 200 of FIG. 2A. Bond pads 235 are arranged in rows, an exterior row 250 and an interior row 255 in the depicted embodiment. Those of bond wires 240 extending from interior row 255 share a common wire-loop profile 260, and those of bond wires 240 extending from exterior row 250 share a common wire-loop profile 265. Thus, unlike the case of FIG. 1A, the configuration of FIGS. 2A and 2B minimizes current-loop areas, and consequently minimizes cross-talk. In addition, signal wires extending in external loop profile 260 are preferably positioned above a shield wire in internal loop 265, and signal wires extending in internal loop profile 265 are preferably positioned beneath a shield wire in external loop profile 260.

Figure 2C:
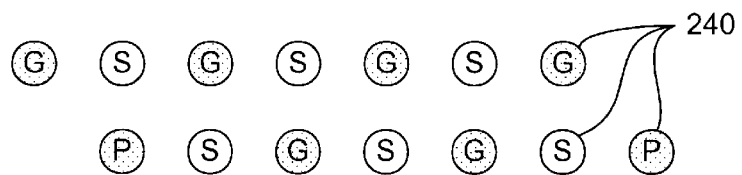
FIG. 2C is a cross-sectional view of bond wires 240 taken along line A—A' of FIG. 2B.

FIG. 2C, a cross-sectional view of bond wires 240 taken along line A—A' of FIG. 2B, illustrates that staggering DC (power "P" and ground "G") and signal ("S") bond wires in and between each wire-bond row creates a checker-board pattern of inter-digitated signal and shield bond wires. The six representative signal lines might be portions of a high-speed data bus, for example. This configuration minimizes cross-talk between signal lines and consequently allows for higher signal bandwidth, and further allows closer spacing of bond wires. Typical buses have eight or more signal lines.One embodiment minimizes the number of bond traces 225 by connecting some of the bond sites within interior wire-bond row 230 with corresponding bond sites within exterior wire-bond row 232. In FIG. 2A, for example, bond site 220A is electrically connected to bond site 220B. Bond sites interconnected between wire-bond rows typically convey power signals.

Figure 3:
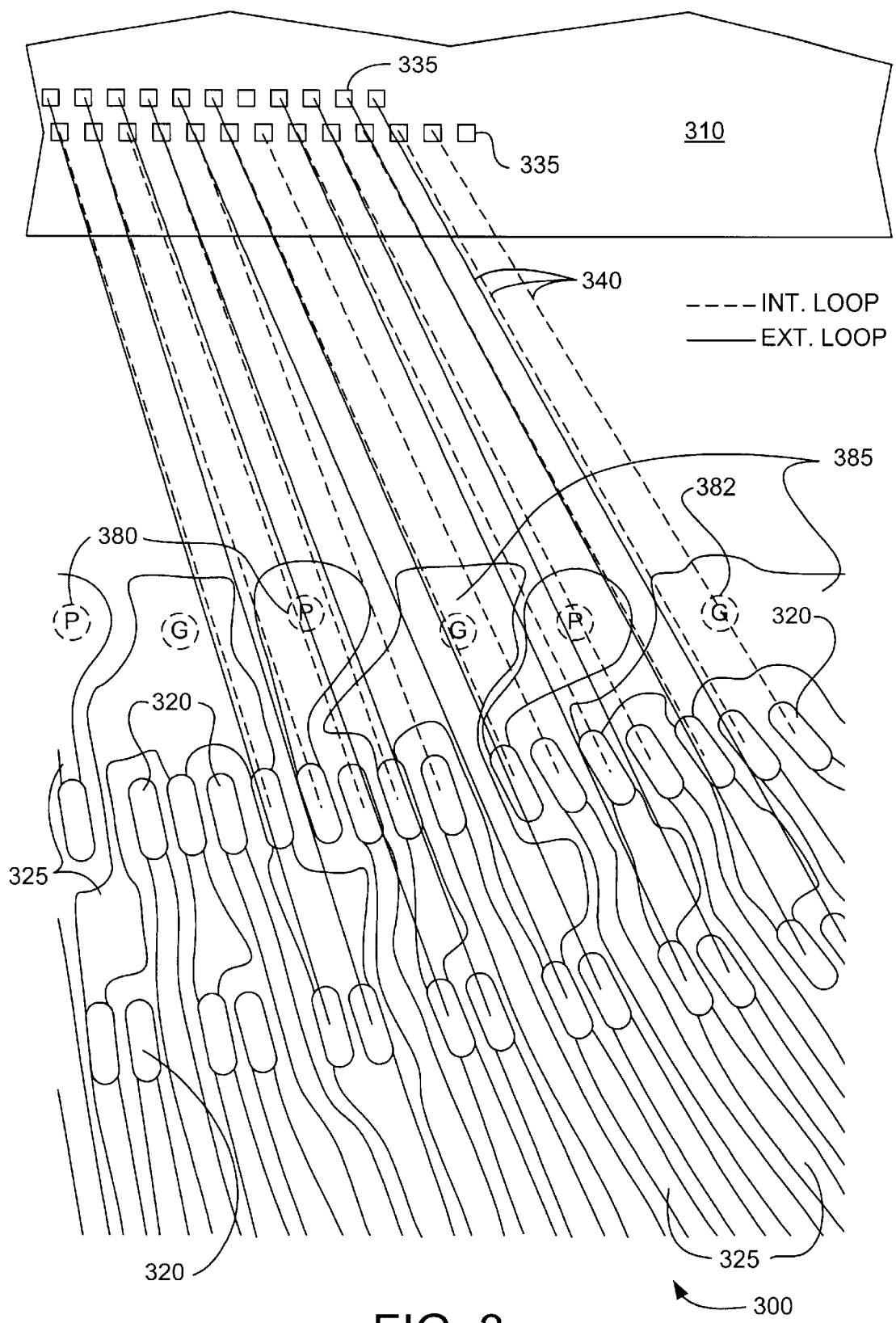
FIG. 3 depicts a portion of a semiconductor device assembly 300 in accordance with another embodiment.

FIG. 3 depicts a portion of a semiconductor device assembly 300 in accordance with another embodiment. Assembly 300 includes a die 310 and a pattern of bond sites 320 and bond traces 325. Various bond pads 335 connect to corresponding bond sites 320 via external-loop bond wires 340 (solid lines) and internal-loop bond wires 340 (dashed lines). Many additional bond pads, bond wires, and bond sites are omitted for brevity.

The spacing of bond pads 335 is selected to compensate for the fanout of bond sites 320. In one embodiment, the two rows of bond sites are spaced one millimeter apart, adjacent bond sites are spaced 170 micrometers apart, and the internal wire-bond row is spaced about 3.5 millimeters from the exterior row of bond pads. The bond sites may be arranged in a radial pattern so that bond wires connecting to bond pads in the center of an edge of semiconductor die 310 extend perpendicular to the edge of the die and bond wires connecting to bond pads at the corners of the semiconductor die extend at an angle of about 45 degrees with respect to the edge of the die. For a more detailed discussion of one arrangement in which the spacing pitch of bond pads are selected to compensate for the fanout of bond sites, see U.S. Pat. No. 5,801,450 to M. Barrow, which is incorporated herein by reference.

Bond sites 320 in the interior and exterior rows are laid out so that wires in the interior and exterior loops are substantially parallel but do not precisely overlap. This configuration provides shielding while allowing visual inspection from above assembly 300 to detect defective or missing bond wires.

A number of the power bond sites connect to ground potential, while others connect to e.g. VDD. In the depicted embodiment, VDD connects to bond sites using vias 380, and ground potential connects to other bond sites through vias 382 extending down into the wiring board from a ground plane 385. The bond traces 325 conveying ground and VDD signals are extended laterally, filling adjacent spaces for improved shielding and reduced bond-trace inductance.

Figure 4:
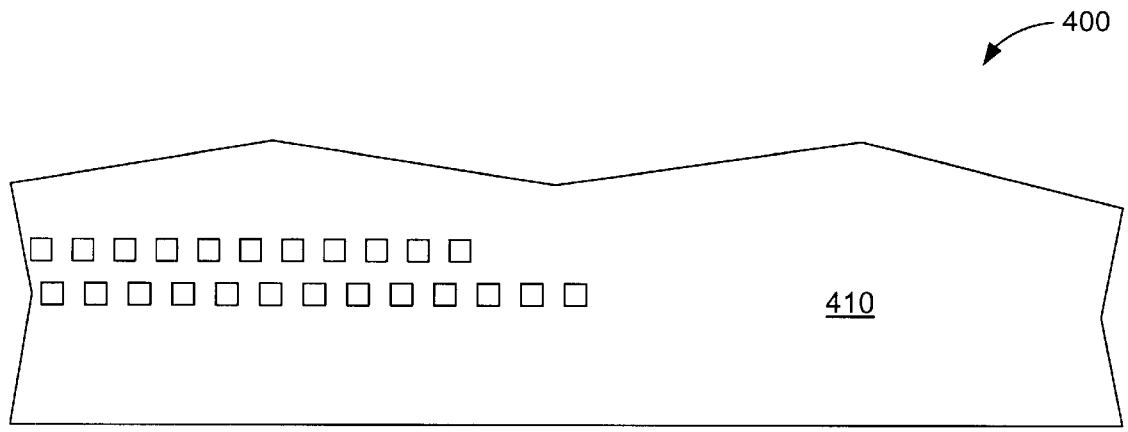
FIG. 4 depicts a portion of a semiconductor device assembly 400 in accordance with another embodiment.
Figure 4:
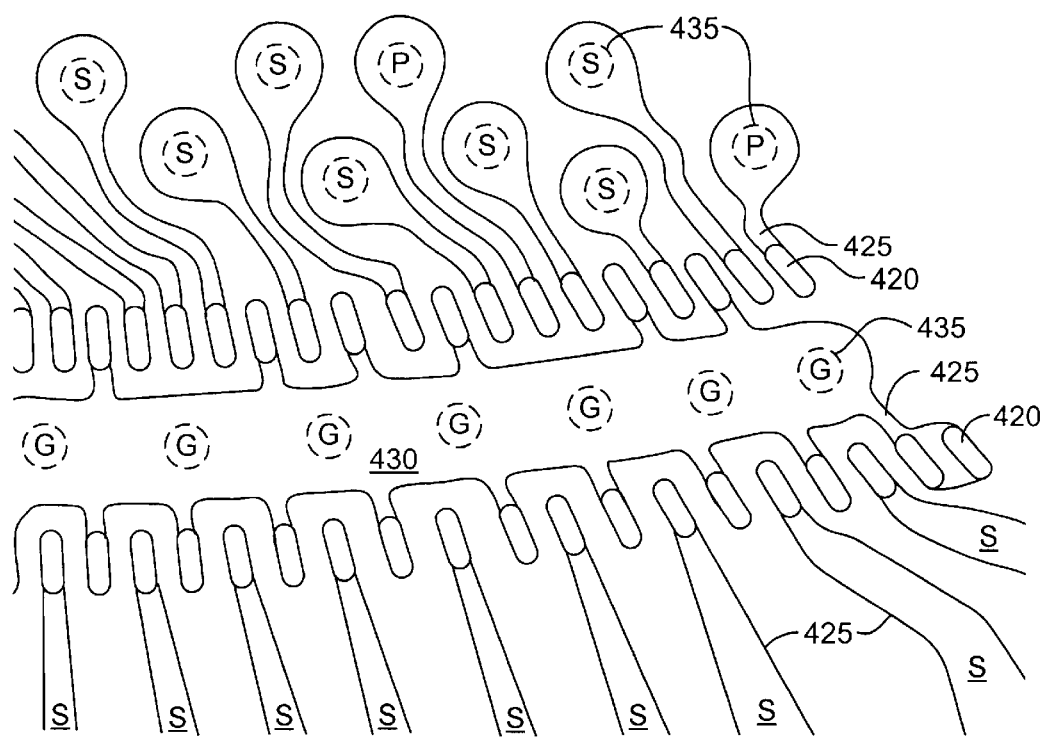

FIG. 4 depicts a portion of a semiconductor device assembly 400 in accordance with another embodiment. Assembly 400 includes a die 410, which is the same as or similar to die 310 of FIG. 3. Assembly 400 additionally includes two rows of bond sites 420, respective bond traces 425, and bond wires (not shown).

In assembly 400, a power ring 430 (e.g., a ground plane) connects to bond sites in each wire-bond row. Each bond site between power ring 430 and die 410 connects to either a signal line (S) or a power supply line (P) through a via 435 that extends into the wiring board upon which bond sites 420 are disposed. Assembly 400, in contrast to assembly 300 of FIG. 3, requires signal lines to be routed on more than one wiring-board layer. This embodiment facilitates wider bond traces, and consequently supports reduced-impedance die packaging.

In one embodiment of the type depicted in FIG. 4, vias 435 connect to the bottom metal layer of the wiring board, and the bottom metal layer is patterned to route out the various signal lines to respective solder balls, or pins. A metal layer within the wiring board and above these signal lines is divided into two regions. The first region lies directly above the signal lines on the bottom layer and is connected to ground potential. The remaining portion of the metal layer is connected to VDD. Grounding the region above the signal lines improves shielding, particularly for applications in which the signal lines routed on the bottom metal layer are referenced to ground potential.

Figure 5:
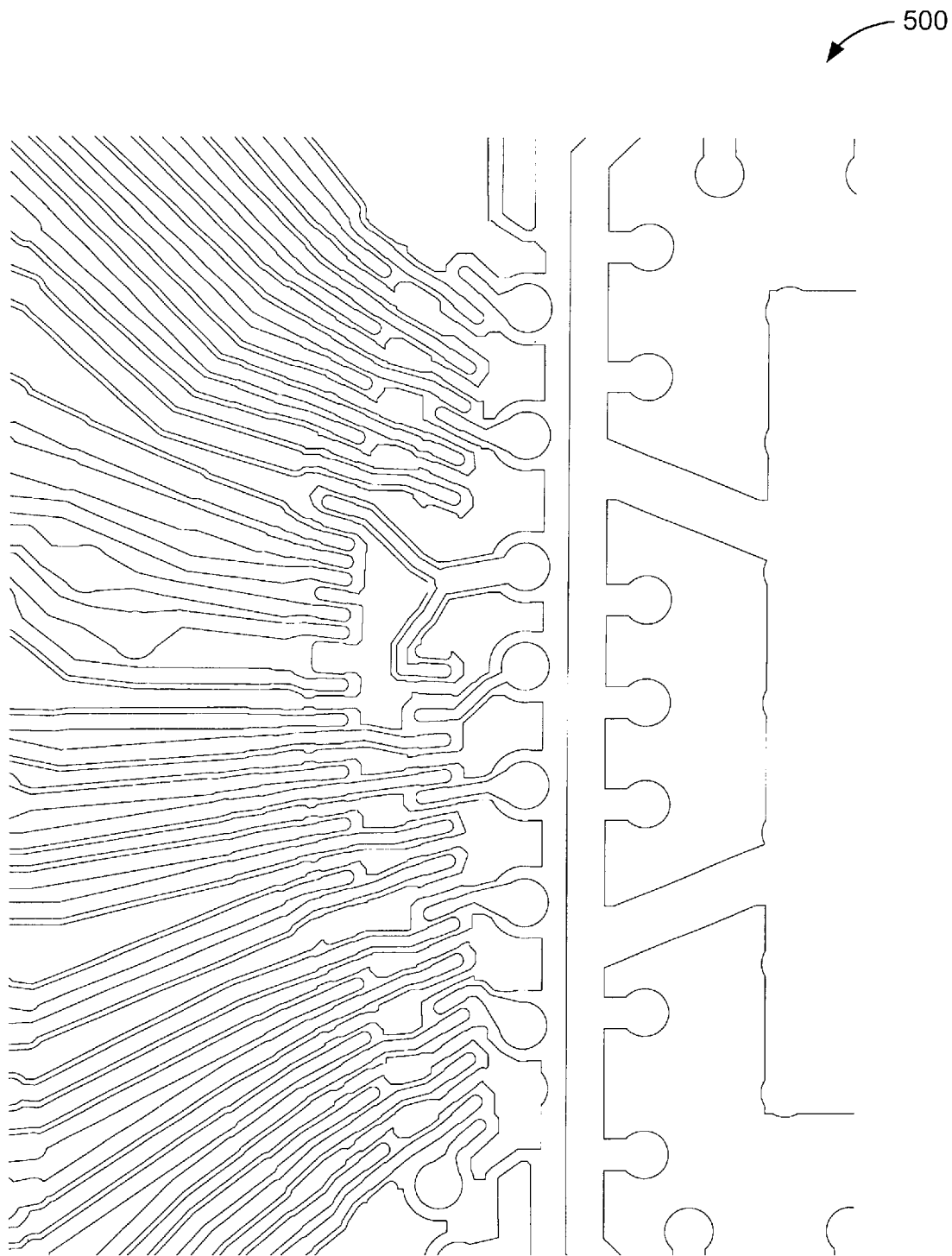
FIG. 5 is a detailed outline of a portion of a die-attach layer 500 defining the bond sites and bond traces of the wiring board depicted in FIG. 3.

FIG. 5 is a detailed outline of a portion of a die-attach layer 500 defining the bond sites and bond traces of the wiring board depicted in FIG. 3. Die-attach layer 500 is the top conductive layer of a 492-pin ball-grid-array package laid out in accordance with an embodiment of the invention.

Figure 6:
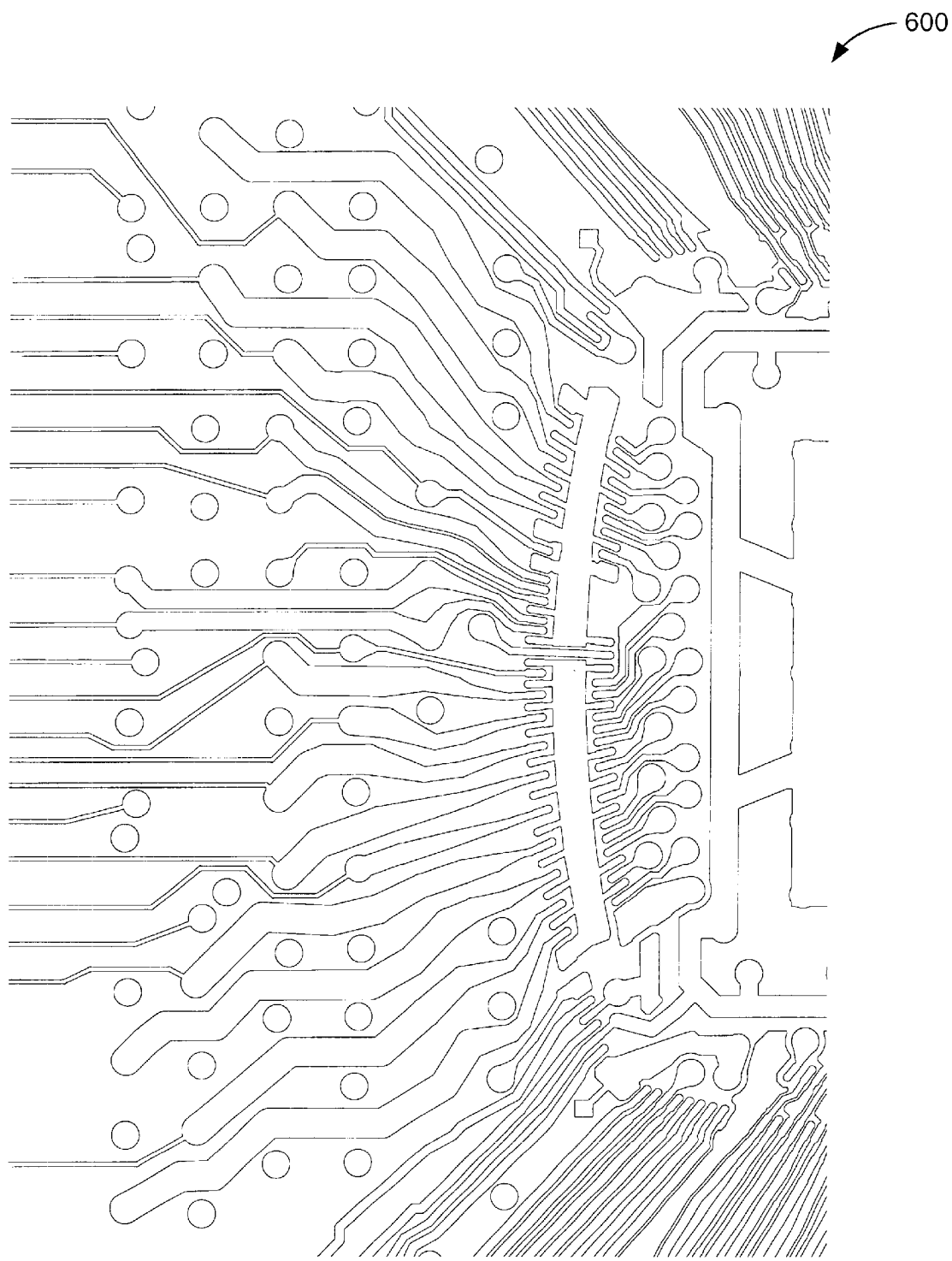
FIG. 6 is a detailed outline of a die-attach layer 600 defining the bond sites and bond traces of the wiring board depicted in FIG. 4.
Figure 7:
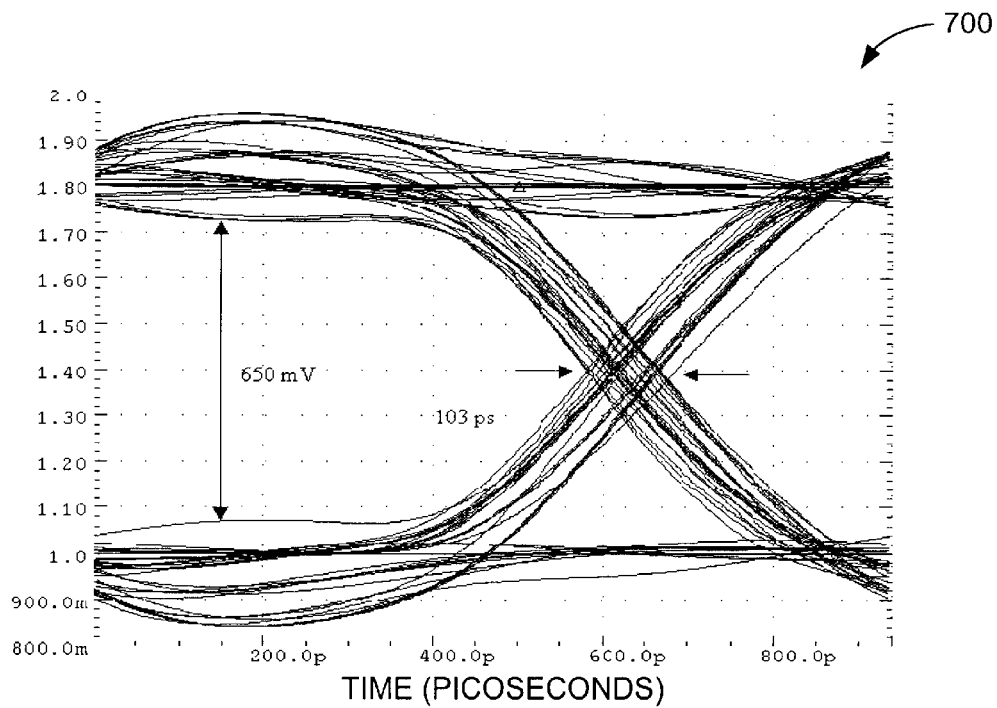
FIG. 7 (Prior Art) is a waveform diagram depicting an "eye" pattern 700 developed by a simulated differential output signal taken between signal and ground terminals of a semiconductor device assembly arranged as shown in prior-art FIGS. 1A and 1B.

FIG. 6 is a detailed outline of a die-attach layer 600 defining the bond sites and bond traces of the wiring board depicted in FIG. 4. FIG. 7 (Prior Art) is a waveform diagram depicting an "eye" pattern 700 developed by a simulated differential output signal taken between signal and ground terminals of a semiconductor device assembly arranged as shown in prior-art FIGS. 1A and 1B. The diagram represents overlaid transitions of a signal selected from the middle of a 9-bit data bus configure. The selected signal (the "victim") is influenced by the eight other signals (the "aggressors") on the remaining eight data lines. In the example, the victim is transmitted between die 110 and wiring board 105 via a bond wire having profile 160 of FIG. 1B. The represented data was modeled using a simulated clock frequency of 533 MHz. In this conventional scheme, the minimum eye voltage of pattern 700 is 650 millivolts, and the switching timing error is 103 picoseconds.

The bit patterns among the aggressors and the victim may be in or out of phase. The victim may be toggling with a different bit pattern than the aggressors, and one may intentionally shift the relative phases of the several signals 180 degrees at different locations in the various bit patterns to simulate noise and the effects of such noise on the victim.

Figure 8:
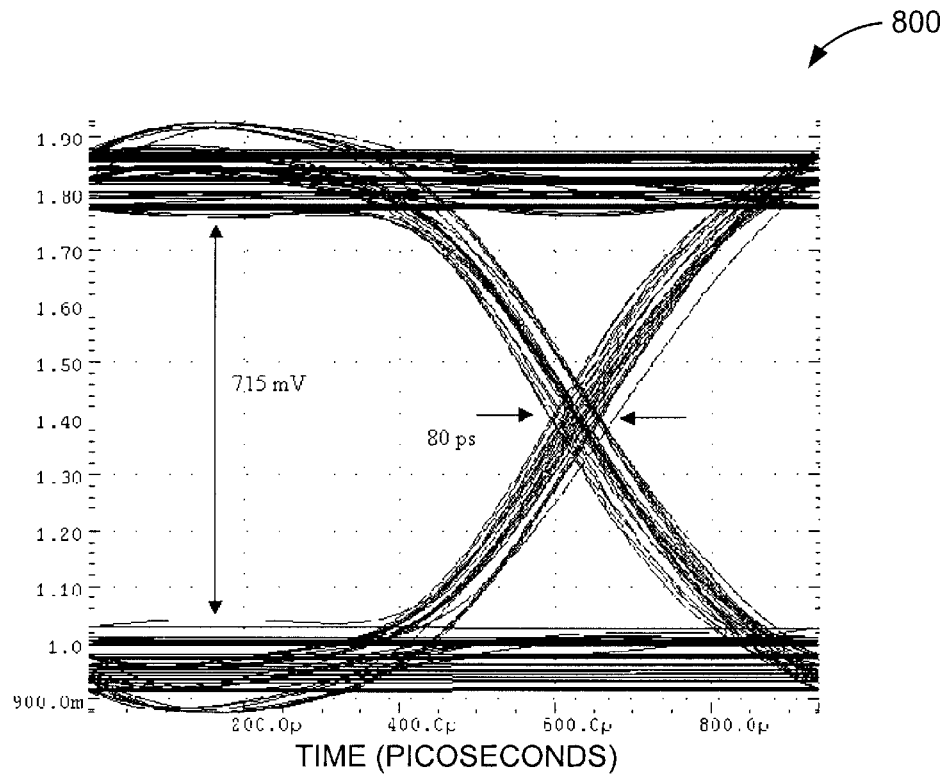
FIG. 8 is a waveform diagram 800 depicting an eye pattern developed by a differential output signal taken between signal and ground terminals of a simulated semiconductor device assembly arranged as shown in FIGS. 3 and 5.

FIG. 8 is a waveform diagram 800 depicting an eye pattern developed by a differential output signal taken between signal and ground terminals of a simulated semiconductor device assembly arranged as shown in FIGS. 3 and 5, using the same signals and other test parameters used in the simulation depicted in FIG. 7. The diagram represents a simulated signal conveyed between die 210 and wiring board 205 via a bond wire having profile 260 of FIG. 2B. In contrast to the conventional scheme of FIGS. 1A and 1B, this assembly in accordance with the invention produces a minimum eye voltage of 715 millivolts, and a switching timing error of 80 picoseconds. Thus, as compared with the device assembly of FIGS. 1A and 1B, a device assembly employing shielding in accordance with the invention improves the voltage margin by approximately 10% and reduces the switching timing error by approximately 22%.

Figure 1B:
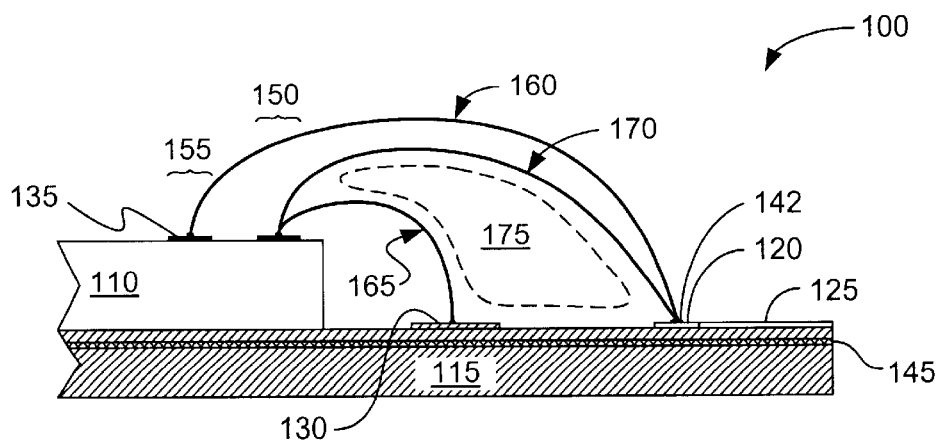
FIG. 1B (Prior Art) is a profile view of semiconductor device assembly 100 of FIG. 1A.
Figure 9:
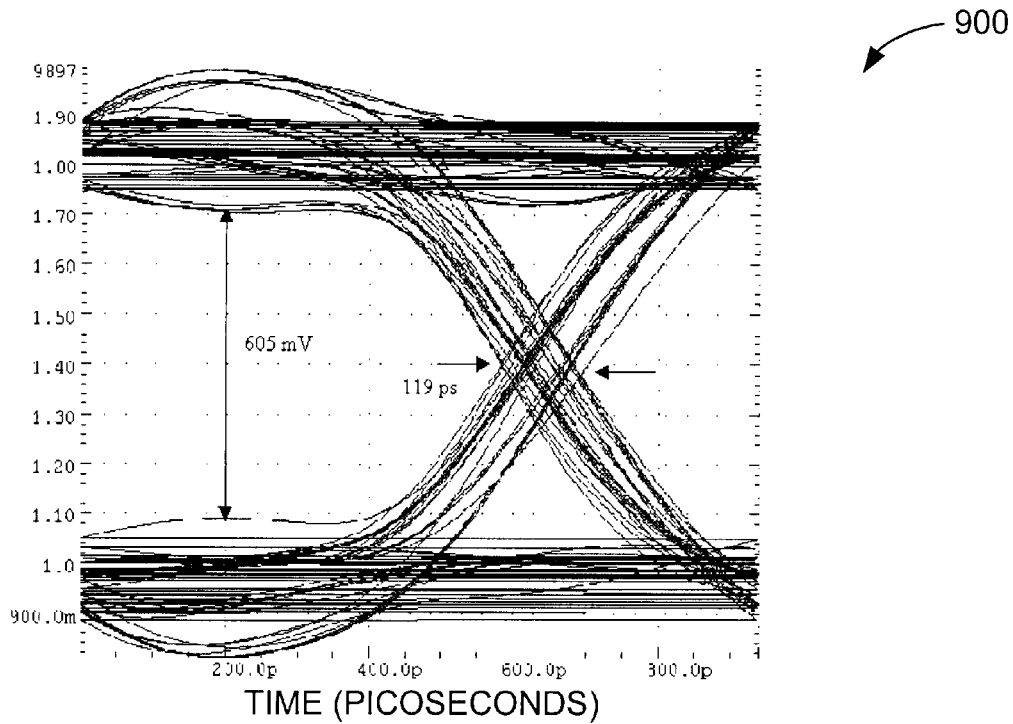
FIG. 9 (Prior Art) is a waveform diagram depicting an eye pattern 900 developed by a simulated differential. output signal taken between signal and ground terminals of a semiconductor device assembly arranged as shown in prior-art FIGS. 1A and 1B.

FIG. 9 (Prior-Art) is a waveform diagram depicting an eye pattern 900 developed by a simulated differential output signal taken between signal and ground terminals of a semiconductor device assembly arranged as shown in prior-art FIGS. 1A and 1B. The diagram represents a simulated signal conveyed between die 110 and wiring board 105 via a bond wire having profile 170 of FIG. 1B. The represented data was modeled in the manner described above in connection with FIG. 7. In this conventional scheme, the minimum eye voltage of pattern 900 is 605 millivolts, and the switching timing error is 119 picoseconds.

Figure 10:
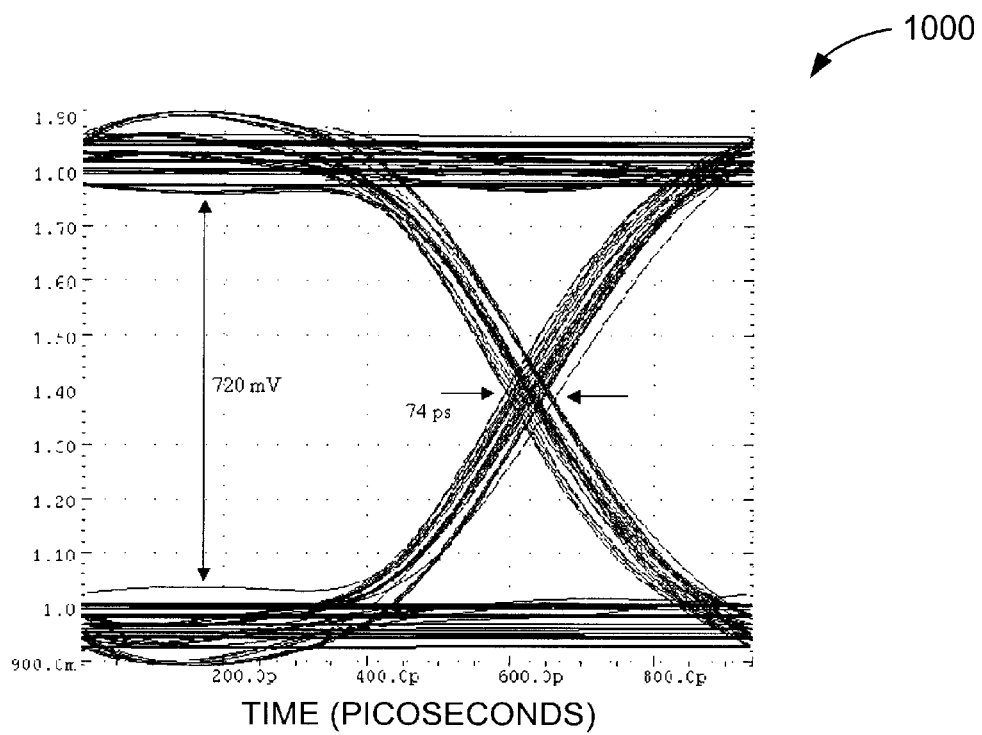
FIG. 10 is a waveform diagram 1000 depicting an eye pattern developed by a differential output signal taken between signal and ground terminals of a simulated semiconductor device assembly arranged as shown in FIGS. 3 and 5.

FIG. 10 is a waveform diagram 1000 depicting an eye pattern developed by a differential output signal taken between signal and ground terminals of a simulated semiconductor device assembly arranged as shown in FIGS. 3 and 5. The diagram represents a simulated signal conveyed between die 210 and wiring board 205 via a bond wire having profile 265 of FIG. 2B. In contrast to the conventional scheme of FIGS. 1A and 1B, assembly 200 produces a minimum eye voltage of 720 millivolts, and a switching timing error of 74 picoseconds. Thus, as compared with the device assembly 100 of FIGS. 1A and 1B, a device assembly employing shielding in accordance with the invention improves the voltage margin by approximately 19% and reduces the switching timing error by approximately 38%.

Assemblies in accordance with the invention work especially well for high-speed buses in which signals are referenced to ground. Such buses generally have a large number of bond wires held to ground potential, and such bond wires are especially useful for shielding. For a detailed discussion of one type of signals referenced to ground, see application Ser. No. 09/588,437 filed Jun. 6, 2000, and entitled "Differential Amplifier with Selectable Hysteresis and Buffered Filter," which is incorporated herein by reference.

While the present invention has been described in connection with specific embodiments, variations of these embodiments will be obvious to those of ordinary skill in the art. For example, the number of rows of bond sites and bond pads may be increased to three or more rows, or the number of bond-pad rows can be limited to one. Moreover, each switching signal line is shielded in the foregoing examples, but this need not be the case. Signals less sensitive to mutual coupling can be conveyed as in the prior art. For example, an assembly that includes one high-speed data bus and other less sensitive signal paths may be configured so that only the data bus is arranged in accordance with the invention. In addition, the invention is not limited to assemblies in which return signals are conveyed via ground, as other types of interfaces will benefit from shielding provided by other circuit potentials. Therefore, the spirit and scope of the appended claims should not be limited to the foregoing description.

What is claimed is:

1. A semiconductor device assembly comprising:
   a circuit die having a row of interior bond pads arranged along a die edge and a row of exterior bond pads arranged along the die edge between the row of interior bond pads and the die edge;
   a package substrate disposed beneath the circuit die and having a row of interior bond sites arranged along the die edge and a row of exterior bond sites arranged along the die edge and separated from the die edge by the row of interior bond sites, wherein a plurality of the interior bond sites are electrically connected to corresponding ones of the exterior bond sites;
   a first plurality of bond wires connected between ones of the exterior bond pads and corresponding ones of the interior bond sites, wherein the first plurality of bond wires includes at least four signal wires and at least four shield wires, and wherein the four signal wires of the first plurality of bond wires are separated from one another by shield wires from among the at least four shield wires of the first plurality of bond wires; and
   a second plurality of bond wires connected between ones of the interior bond pads and ones of the exterior bond sites electrically connected to the corresponding one of the interior bond sites, wherein the second plurality of bond wires includes at least four signal wires and at least four shield wires, and wherein the four signal wires of the second plurality of bond wires are separated from one another by shield wires from among the at least four shield wires of the second plurality of bond wires;
   wherein the four signal wires from the first plurality of bond wires extend beneath and, in at least one dimension, substantially in parallel with shield wires of the second plurality of bond wires.

2. A semiconductor device assembly comprising:
   a circuit die having a row of interior bond pads arranged along a die edge and a row of exterior bond pads arranged along the edge between the row of interior bond pads and the edge;
   a package substrate having a row of interior bond sites and a row of exterior bond sites, wherein a plurality of the interior bond sites are electrically connected to corresponding ones of the exterior bond sites;
   a first plurality of bond wires connected between ones of the exterior bond pads and corresponding ones of the interior bond sites; and
   a second plurality of bond wires connected between ones of the interior bond pads and ones of the exterior bond sites electrically connected to the corresponding one of the interior bond sites.

3. The semiconductor device assembly of claim 2, wherein the first plurality of bond wires includes at least two signal wires and at least three shield wires, and wherein the two signal wires of the first plurality of bond wires are separated by and substantially in parallel with at least one of the shield wires of the first plurality of bond wires.

4. The semiconductor device assembly of claim 3, wherein the second plurality of bond wires includes at least two signal wires and at least three shield wires, and wherein the two signal wires of the second plurality of bond wires are separated by and substantially in parallel with at least one of the shield wires of the second plurality of bond wires.

5. The semiconductor device assembly of claim 4, wherein the two signal wires from the first plurality of bond wires extend beneath and, in at least one dimension, substantially in parallel with ones of the shield wires from the second plurality of bond wires.

6. The semiconductor device assembly of claim 4, wherein at least one of the shield wires is a ground line.

7. The semiconductor device assembly of claim 4, wherein the first and second pluralities of bond wires each include at least four signal wires, and wherein each of the four signal wires is adjacent to two of the shield wires in a horizontal dimension and one of the shield wires in a vertical dimension.

8. The semiconductor device assembly of claim 4, wherein each of the signal wires in the second plurality of bond wires is disposed over a shield wire in the first plurality of bond wires.

9. The semiconductor device assembly of claim 4, wherein each signal wire in the first plurality of bond wires is separated from the remaining signal wires in the first plurality of bond wires by at least one shield wire disposed substantially in parallel with the signal wires in the first plurality of bond wires.

10. The semiconductor device assembly of claim 9, wherein each signal wire in the second plurality of bond wires is separated from the remaining signal wires in the second plurality of bond wires by at least one shield wire disposed substantially in parallel with the signal wires in the second plurality of bond wires.

11. The semiconductor device assembly of claim 10, wherein each of the signal wires in the second plurality of bond wires is disposed over a shield wire in the first plurality of bond wires.

12. A bus for conveying at least eight signals in parallel between a package substrate and a circuit die, the at least eight signals divided into first and second signal subsets, the bus comprising:
    a first row of wire bonds arranged on a surface of the package substrate, the first row of wire bonds including alternating shield and signal wire bonds, the signal wire bonds in the first row adapted to convey the first subset of the at least eight signals; and
    a second row of wire bonds arranged on the surface of the package substrate, the second row of wire bonds including alternating shield and signal wire bonds, the signal wire bonds in the second row adapted to convey the second subset of the at least eight signals.

13. The bus of claim 12, wherein the surface of the package substrate further comprises signal traces connected to the signal wire bonds of the first row of wire bonds, and wherein a plurality of the signal traces extend between ones of the second row of wire bonds.

14. The bus of claim 13, wherein each of the signal traces extend through and area on the surface of the package substrate separating a signal wire bond in the second row of wire bonds and a shield wire bond in the second row of wire bonds.

15. The bus of claim 12, further comprising:
   a circuit die having a row of interior bond pads arranged along a die edge and a row of exterior bond pads arranged along the die edge between the row of interior bond pads and the die edge;
   a first plurality of bond wires, each extending from one of the first row of wire bonds to a respective one of the exterior bond pads; and
   a second plurality of bond wires, each extending from one of the second row of wire bonds to a respective one of the interior bond pads.

16. The bus of claim 15, wherein bond wires of the first plurality of bond wires do not cross one another.

17. The bus of claim 15, wherein bond wires of the second plurality of bond wires do not cross one another.

18. The bus of claim 12, wherein the first and second rows of wire bonds are separated by a power trace arranged on the surface of the package substrate.

19. The bus of claim 18, wherein the power trace surrounds the circuit die.

20. The bus of claim 19, wherein the power trace is a ground trace.

21. The bus of claim 19, wherein a number of the wire bonds in the first row of wire bonds connect to the power trace.

22. The bus of claim 20, wherein a number of the wire bonds in the second row of wire bonds connect to the power trace.

23. The bus of claim 12, further comprising an integrated circuit die having a plurality of signal bond pads connected via signal bond wires to the signal wire bonds and a plurality of shield bond pads connected via shield bond wires to the shield wire bonds.

24. The bus of claim 23, wherein the plurality of signal bond pads connect to alternating ones of the wire bonds in the first row of wire bonds on the substrate and to alternating ones of the wire bonds in the second row of wire bonds on the substrate.

25. The bus of claim 24, wherein the plurality of shield bond pads connect to ones of the wire bonds in the first and second rows of wire bonds between the signal wire bonds.

26. The bus of claim 23, wherein the shield wire bonds are adapted to provide at least one power-supply voltage to the circuit die.

27. The bus of claim 23, wherein the signal wire bonds are adapted to convey relatively high frequency signals, and wherein at least one of the shield wire bonds is adapted to convey relatively low-speed signals.

* * * * *

UNITED STATES PATENT AND TRADEMARK OFFICE
CERTIFICATE OF CORRECTION

PATENT NO.     : 6,538,336 B1
DATED          : March 25, 2003
INVENTOR(S)    : Secker et al.

It is certified that error appears in the above-identified patent and that said Letters Patent is hereby corrected as shown below:

Column 3,
Line 36, remove the "." after the word "differential".

Column 6,
Line 3, change the word "configure" to -- configuration --.

Signed and Sealed this

Tenth Day of June, 2003

JAMES E. ROGAN
*Director of the United States Patent and Trademark Office*